United States Patent [19]

Prentice

[11] Patent Number: 5,357,089
[45] Date of Patent: Oct. 18, 1994

[54] CIRCUIT AND METHOD FOR EXTENDING THE SAFE OPERATING AREA OF A BJT

[75] Inventor: John S. Prentice, Palm Bay, Fla.

[73] Assignee: Harris Corporation, Melbourne, Fla.

[21] Appl. No.: 23,117

[22] Filed: Feb. 26, 1993

[51] Int. Cl.[5] .................................. H03F 3/04
[52] U.S. Cl. ............................ 330/298; 330/289; 330/296; 330/207 P
[58] Field of Search ........... 330/298, 289, 296, 207 P; 307/302, 491, 300; 361/87, 84, 56, 18

[56] References Cited

U.S. PATENT DOCUMENTS

| | | | |
|---|---|---|---|
| 2,864,904 | 12/1958 | Jensen | 330/296 |
| 4,090,227 | 5/1978 | Schweitzer | 361/84 |
| 4,092,613 | 5/1978 | Boubouleix | 330/289 |
| 4,612,451 | 9/1986 | Maekawa et al. | 307/300 |

FOREIGN PATENT DOCUMENTS 1137564 1/1985 U.S.S.R. .................. 330/207 P

*Primary Examiner*—James B. Mullins
*Assistant Examiner*—Jim Dudek
*Attorney, Agent, or Firm*—Rogers & Killeen

[57] ABSTRACT

A circuit and method for protecting a transistor during operation transistor's $BV_{CEO}$ by limiting the reverse base current. The reverse base current is used to adjust the applied base-emitter voltage. Limiting the reverse base current keeps the collector and emitter currents within safe limits and thus extends the safe operating area of the transistor. The invention finds application as an overvoltage sensor and transistor protector circuit and is particularly applicable to implementation in an integrated circuit. The circuit may be combined with circuits for the protection of a transistor against excessive current and temperature in a high voltage linear regulator.

35 Claims, 6 Drawing Sheets

CIRCUIT AND METHOD FOR EXTENDING THE SAFE OPERATING AREA OF A BJT

BACKGROUND OF THE INVENTION

The present invention relates to a circuit and a method for detecting an overvoltage condition and for protecting a transistor in response thereto. Detection of the overvoltage condition may be integrated with protection for an overcurrent condition as well as excessive heat, and is accomplished by sensing a reverse base current. The safe operating area ("SOA") of the transistor may be extended in response to the detected condition by reducing the externally generated base-emitter current.

Transistor operation in a forward active state is usually limited to an SOA that is defined in the collector voltage/collector current plane, an example of which may be seen in FIG. 1. Operation outside the SOA can result in transistor failure from high temperatures caused by excessive power dissipation.

With reference to FIG. 1, the line A-B represents the upper limit of the transistor's current carrying capability and the line B-C illustrates the basic thermal limitation associated with the maximum allowable junction temperature, i.e., the first breakdown condition. The line C-D-E illustrates the limit imposed by the second breakdown discussed below, and the line E-F is the collector-emitter breakdown voltage $BV_{CEO}$, i.e., the maximum voltage that can be applied from the collector to the emitter with the transistor's base open circuited ($I_B=0$). The present invention is directed to extending the SOA limits defined by the line C-D-E-F as suggested by dashed line C-G-H in FIG. 1; that is, in the areas limited by second breakdown and the $BV_{CEO}$.

The second breakdown limitation may be the result of several mechanisms. One mechanism is localized thermal run-away; that is, non-homogeneous current densities in the transistor that cause localized "hot spots". This mechanism can be controlled by keeping the current density uniform across the emitter. To this end, the transistor can be modified to include multiple emitters with small ballasting resistors.

The second mechanism, the one to which the present invention is addressed, is related to a phenomena known as avalanche multiplication that may be more clearly understood with reference to FIG. 2. With reference to FIG. 2, assume transistor Q1 is operating with a collector current $I_c$ that is much greater than an externally supplied base (biasing) current $I_B$ and that the collector to base voltage $V_{CB}$ is increasing. As the collector electrons pass through the collector-base depletion region, they gain energy from the electric field (VCB). At some voltage, a few of the collector electrons have enough energy to generate electron-hole pairs when they collide with a lattice atom. The number of collector electrons that generate electron-hole pairs increases exponentially with the electric field as is shown in Equation (1) below.

$$M \approx \exp((V_{CB}-K_1)/K_2) \quad (1)$$

where $K_1$ and $K_2$ are constants dependent on the construction of the transistor, and
where $M \leq 1$.

The generation of the electron-hole pairs causes the collector current to increase beyond that associated with the base current to the point of transistor failure.

Avalanche multiplication increases collector current in two ways, i.e., directly due to the new electrons, and indirectly due to the increase in base current from the new holes, assuming a constant external base current. In other words, the new electrons are added to the collector current $I_c$ while the new holes go to the base and are added to the externally base current $I_B$. At $BV_{CEO}$, the component of base current generated by the new holes is sufficient to keep the transistor on without any base current from an external source. Above $BV_{CEO}$, the base current $I_B$ actually reverses direction from that shown in FIG. 2. As may be seen in FIG. 1, the situation where voltage is increasing and current is increasing (due to avalanche multiplication) will quickly drive transistor operation out of the SOA.

Nevertheless, situations exist where it is desirable to have a transistor that is able to operate outside of its traditional SOA to its $BV_{CES}$ (or $BV_{CBO}$). For example, there are applications where a transistor is normally operating at voltages only slightly below its $BV_{CEO}$ and there may be disturbances on the high voltage supply which would take the collector-emitter voltage of the transistor above $BV_{CEO}$. The transistor may not have to supply full load current during such a disturbance, but it is desirable that the transistor survive. A transistor with this ability may be useful, for example, in a prior art high voltage linear voltage regulator such as illustrated in FIG. 2.

A transistor can be operated at voltages above $BV_{CEO}$ if its collector current is sensed and controlled. This may be accomplished by using a high voltage, voltage sensing element. However, unless the collector current is limited to a small value, the need to dissipate power from such an element will present space and/or heat problems. For example, a high voltage resistor divider network (or a combination of a resistor network and a Zener diode) could be used, but the area of the resistor would be quite large and would not likely find application in most integrated circuits where space is typically a major concern.

Accordingly, it is an object of the present invention to provide a novel overvoltage detection circuit and method.

Another object of the present invention is to provide an novel circuit and method for extending the SOA of a transistor so that the transistor can safely operate with voltages above its $BV_{CEO}$.

It is a further object of the present invention to provide a novel circuit and method for controlling the collector current in a transistor so that its SOA is extended.

It is yet a further object of the present invention to provide a novel integrated circuit for detecting the magnitude and direction of a transistor's base current.

It is another object of the present invention to provide a novel circuit and method for extending a transistor's SOA by reducing externally supplied base current responsive to detection of reverse base current above a predetermined threshold.

It is yet another object of the present invention to provide a novel circuit and method for detecting excessive voltage, current and heat in an integrated circuit transistor.

Yet a further object of the present invention to provide a novel circuit and method for protecting an integrated circuit transistor against excessive voltage, current and heat.

Yet still a further object of the present invention to provide a novel high voltage linear regulator and method.

These and many other objects and advantages of the present invention will be readily apparent to one skilled in the art to which the invention pertains from a perusal of the claims, the appended drawings, and the following detailed description of preferred embodiments.

DESCRIPTION OF PREFERRED EMBODIMENTS

Figure 3:
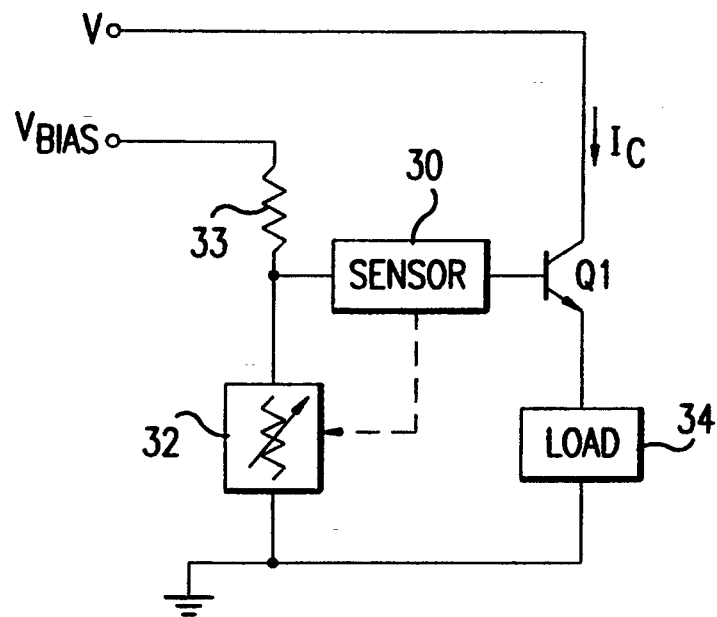
FIG. 3 is a diagram of one embodiment of the voltage protection circuit of the present invention.

With reference now to the embodiment of FIG. 3, the detector circuit and method of the present invention may be used to protect an NPN transistor Q1 at voltages above the transistor's $BV_{CEO}$. A reverse current at the base of transistor Q1 may be detected with a suitable conventional sensor 30 and, in response to the sensed current, may be used to adjust an externally supplied base bias voltage, $V_{BIAS}$.

It is to be understood that the load 34 may have a fixed or variable impedance and may be connected to either the emitter or collector of transistor Q1. Similarly transistor Q1 may be any bipolar junction transistor (BJT), either PNP or NPN, and the circuit may be constructed as in integrated circuit or with discrete circuit components.

The adjustment of the externally supplied base bias voltage may, as shown in FIG. 3, be made by adjusting the variable element 32 of a voltage divider network comprising elements 32 and 33 or by selectively tapping a single element (not shown). In a preferred embodiment, the impedance of element 32 may be infinite (an open circuit) to place the entire $V_{BIAS}$ on the base of the transistor Q in the absence of an overvoltage condition.

Figure 1:
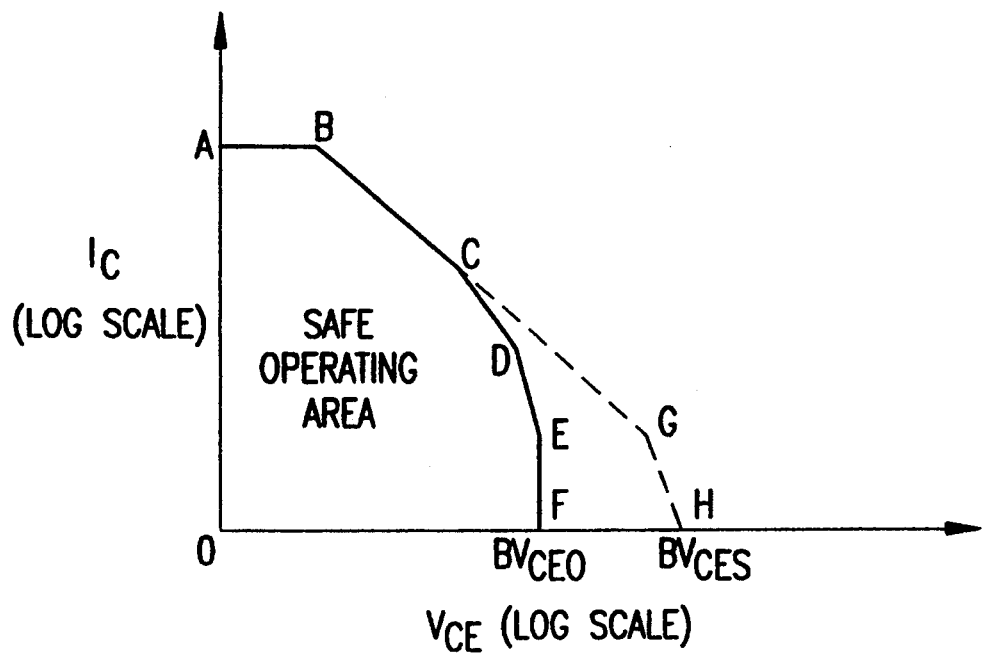
FIG. 1 is a graphical depiction of a transistor safe operating area illustrating in dashed lines the improvement afforded by the present invention.
Figure 2:
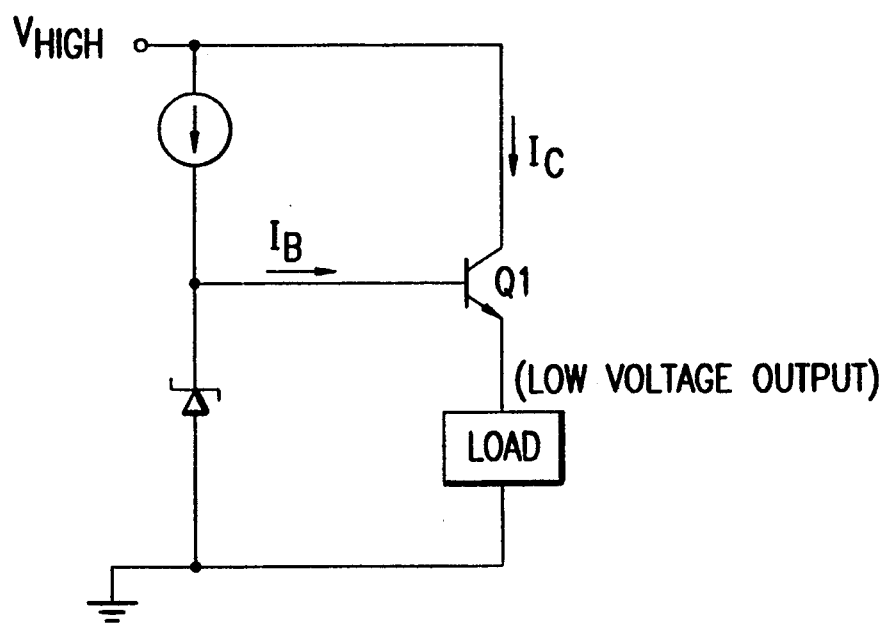
FIG. 2 is a circuit diagram of a prior art high current, linear voltage regulator in which the present invention may find application.

The SOA of a transistor may be extended by limiting the collector current because the second breakdown mechanism that defines a portion of the SOA limit (line C-D-E in FIG. 1) is shifted to a higher voltage level (dashed line C-G in FIG. 1.) The second breakdown limit is shifted in the present invention by reducing the external base current in the presence of internal base current to thereby limit the total base current.

By way of further explanation, total base current $I_{B,total}$ has two components, $$I_{B,total}=I_{B,ext}-MI_C \quad (2)$$

where $I_{B,ext}=I_C/\beta_F$ and is related to the applied base-emitter voltage $V_{BE}$, and where M is set forth in Equation (1) above and increases with increasing collector-base voltage, $V_{CB}$.

If $I_{B,ext}$ is fixed, an increase in $V_{CB}$ to the point that $I_{B,total}$ becomes negative indicates that the avalanche multiplication process has occurred and that the transistor will exceed its SOA limits, unless the avalanche is controlled. This detection may be used to provide an alarm, but may also be used as shown in FIG. 3 to perform a control function and to protect the transistor.

The present invention reduces $I_{B,ext}$ when $I_{B,total}$ reaches a predetermined negative value and the reduction in $I_{B,ext}$ will reduce the effects of avalanche multiplication. $I_{B,ext}$ may be reduced as required, and may even become negative so as to absorb the avalanche generated current. In this way, $I_C$ may be controlled and the transistor's SOA extended.

With reference again to FIG. 3, the element 32 normally has a very high impedance (effectively does not conduct). When the sensor 30 senses a reverse base current above a predetermined value, the impedance of the element 32 is reduced to connect the external source of biasing voltage $V_{BIAS}$ to ground across the element, and the resulting voltage drop reduces the voltage at the base of transistor Q1 and thus the total base current $I_{B,total}$. In other words, the transistor Q1 can operate with voltages between its $BV_{CEO}$ and $BV_{CES}$ (or $BV_{CO}$) by controlling the transistor base bias voltage to limit the total base current $I_{B,total}$ of the transistor to a predetermined maximum value.

Figure 4:
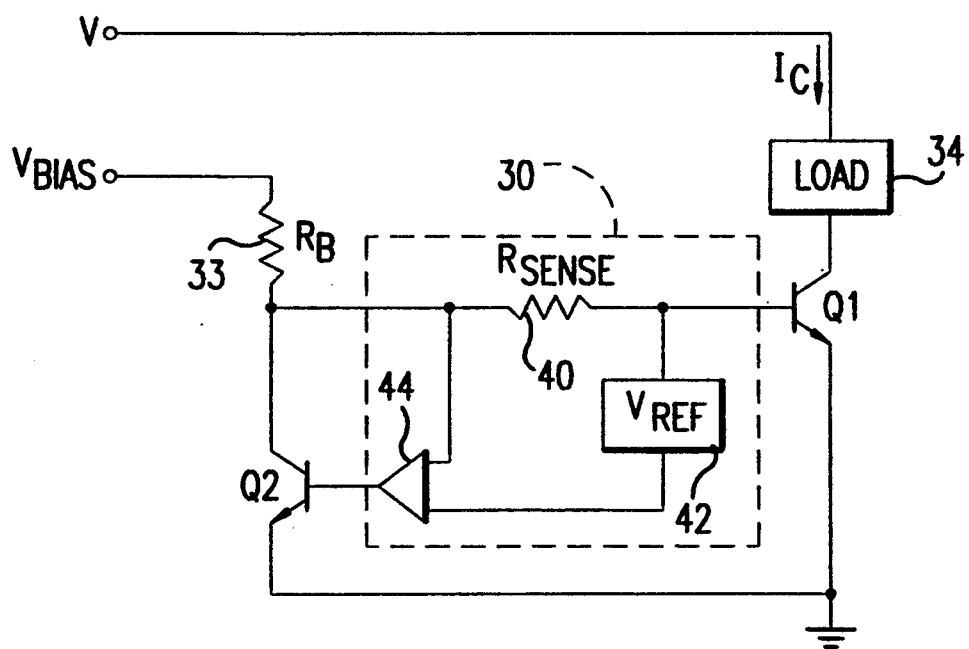
FIG. 4 Is a diagram of a second embodiment of the voltage protection circuit of the present invention.

The variable impedance element 32 may conveniently take the form of a suitable convention semiconductor device such as the single NPN transistor Q2 illustrated in FIG. 4.

The sensor 30 of FIG. 3 is the detector of the present invention. It may take various embodiments, with those adaptable to an integrated circuit being preferred. Such sensors desirably do not use excessive space and do not pose power dissipation problems that may be encountered with large resistors. By way of example, and with reference to FIG. 4, sensor 30 may include a small resistive sensing element 40 and a source 42 of reference voltage as input signals to an error amplifier 44. The amplifier 44 provides an output signal when the voltage across element 40 related to a reverse base current equals the reference voltage provided by the source 42.

The output signal from the amplifier 44 is the output signal from the detector and may in turn be used to turn on transistor Q2. When transistor Q2 conducts, the externally applied base-emitter voltage is connected to ground, thereby decreasing the total base current to transistor Q1 and providing overvoltage protection for the transistor Q1.

Figure 5:
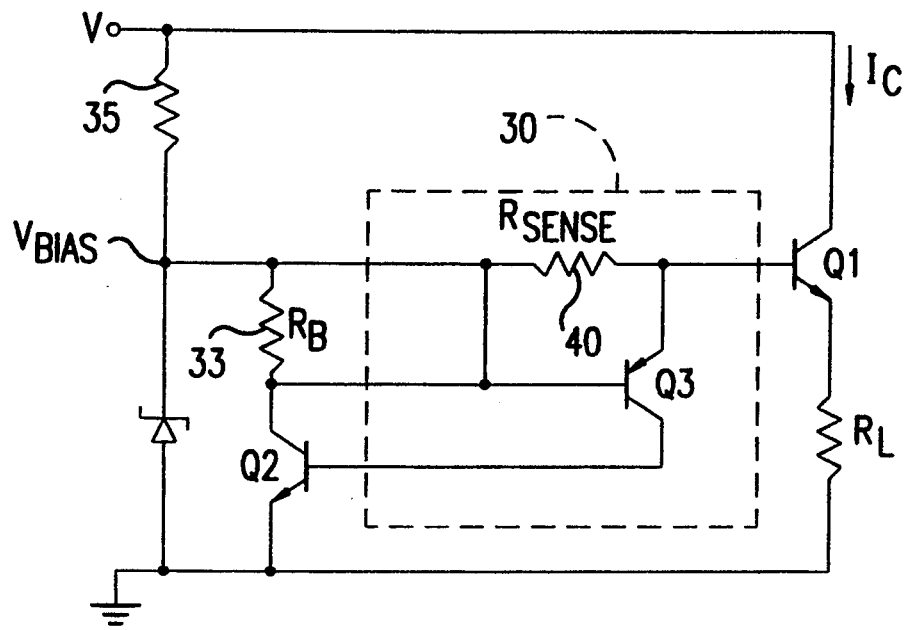
FIG. 5 is a diagram of a third embodiment of the voltage protection circuit of the present invention.

With reference to FIG. 5, a second embodiment of the detector is illustrated in a high voltage, linear voltage regulator. In this embodiment, the voltage reference source 42 and amplifier 44 of FIG. 4 are replaced with a single PNP transistor Q3, with the transistor Q2 turned on when the voltage across the sensor 40 related to the reverse base current is sufficient to cause the transistor Q3 to conduct and to provide an output signal at the collector thereof.

The output signal from the detector may also be used to protect the transistor by controlling the conduction of NPN transistor Q2, to thereby control the base bias voltage provided by a voltage divider network comprising resistors 33 and 35, the transistor Q1 and a Zener diode.

Figure 6:
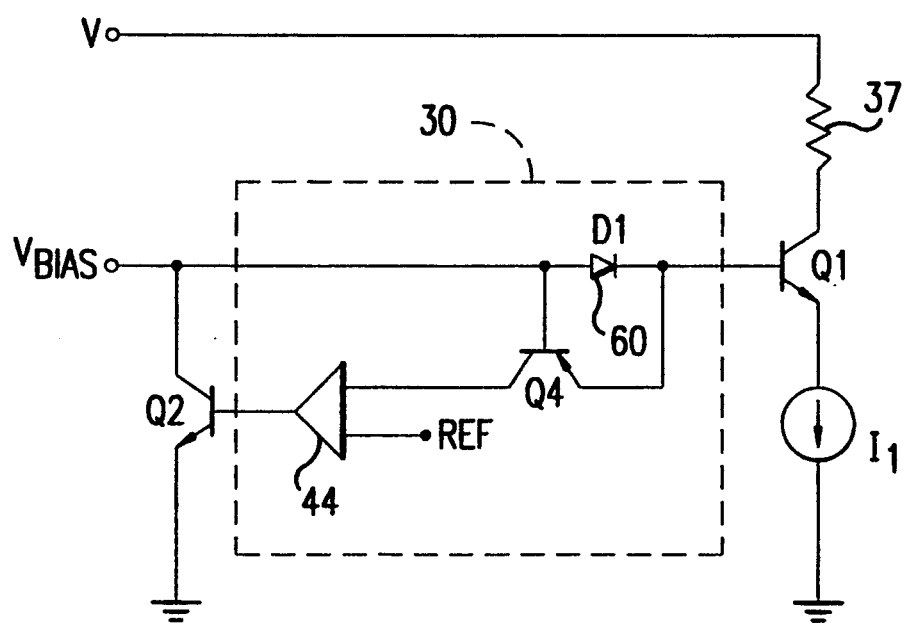
FIG. 6 is a diagram of a fourth embodiment of the voltage protection circuit of the present invention.

The sensing of reverse base current as a detector of high voltage may also be as shown in FIG. 6 where a unidirectional circuit element such as a diode 60 allows biasing current to reach the base of transistor Q1 while blocking a reverse base current. The voltage drop across the diode 60 due to the reverse base current controls the conduction of transistor Q4 and is applied to a suitable conventional comparator 44. When the reverse base current exceeds the reference, the comparator 44 provides an output signal indicating that transistor Q1 is carrying a voltage that is about to exceed a specified limit, such as that defined by the SOA.

The voltage level to be detected must be above the $BV_{CEO}$ of the sensor transistor Q4 and the maximum applied voltage V must be less than the $BV_{CES}$ of the transistor Q1.

As discussed above, this indication of an overvoltage condition may be used as is shown in FIG. 6 to control the conduction of a transistor Q2 to provide overvoltage protection for the transistor Q1 by reducing the external base bias.

As shown in FIG. 6, the transistor Q1 is biased with a current sink I, which fixes the emitter and collector current passing through the load (not shown). The high voltage threshold may be adjusted upwardly by reducing the sensitivity of the amplifier 44, by adjusting the current sink I or the resistor 37, or by placing a Zener diode or other breakdown service in series with the collector of transistor Q1.

Figure 7:
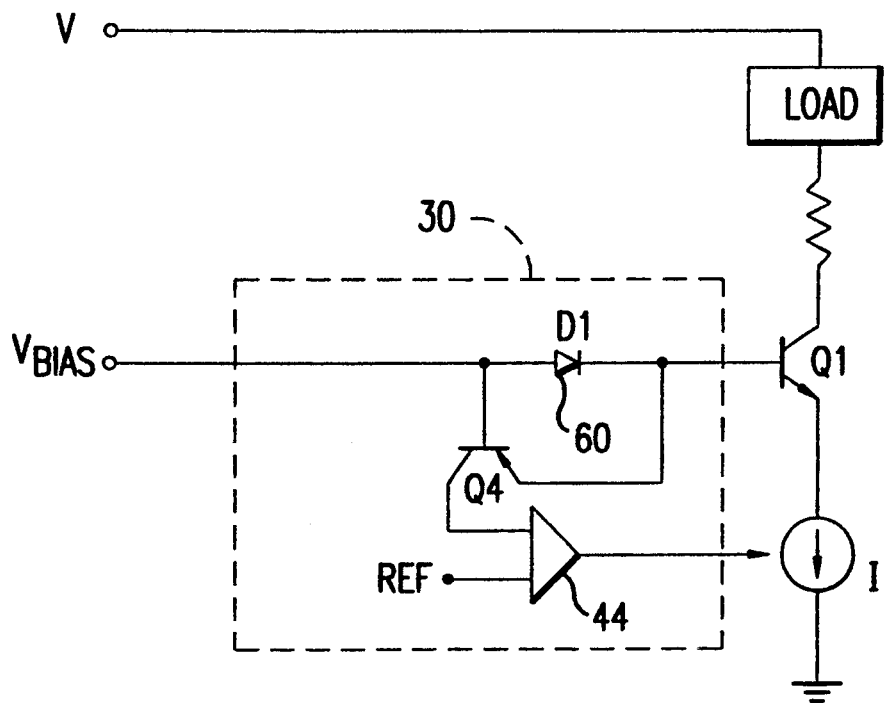
FIG. 7 is a diagram of a fifth embodiment of the voltage protection circuit of the present invention.

As shown in FIG. 7, the output signal from the detector 30 may be applied as a control signal to the current sink I to provide protection for the transistor Q1.

Figure 8:
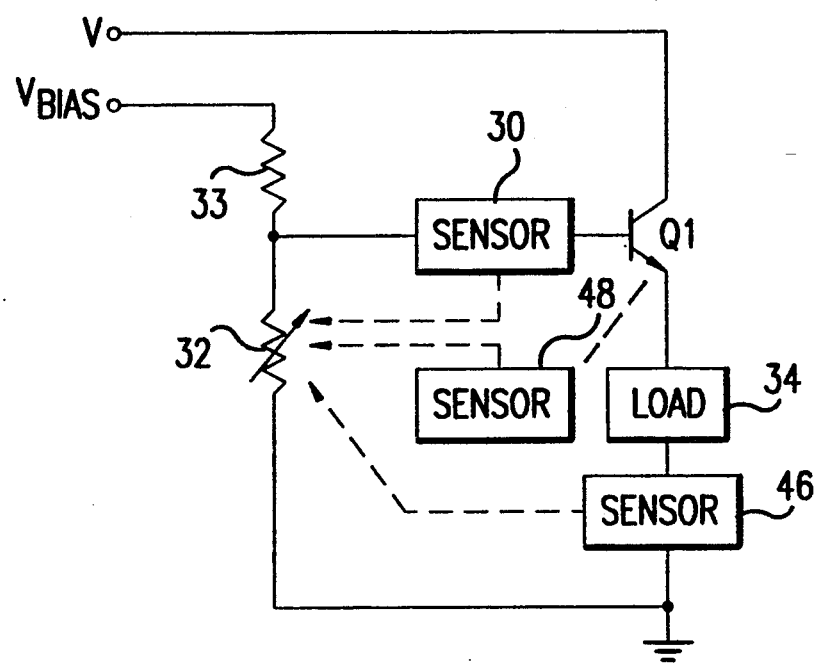
FIG. 8 is a diagram of one embodiment of the voltage, current and thermal protection circuit of the present invention.

A more complex high voltage linear regulator is shown in FIG. 8 where protection for excessive voltage, current and heat is provided. As shown in FIG. 8, the sensor 30 is responsive to the detection of a reverse base current as indicative of an excessive voltage across the transistor Q1. A suitable conventional load current sensor 46 may be located in the collector-emitter path of the transistor Q1 to detect an excessive current. A third sensor 48 may be any suitable conventional sensor used to detect excessive heat in the transistor Q1. The sensor 48 need not be electrically connected to the transistor Q1 so long as it is in thermal communication therewith, e.g., connected to a common heat sink.

The output signals from each of the three sensors 30, 46 and 48 may be used to independently control the impedance of the element 32 to change the base bias voltage and thus the current through the transistor Q1 as earlier described in connection with FIGS. 3–7. This circuit is particularly advantageous when implemented in an integrated circuit, where the element 32 and each of the three sensors may be transistors.

Figure 9:
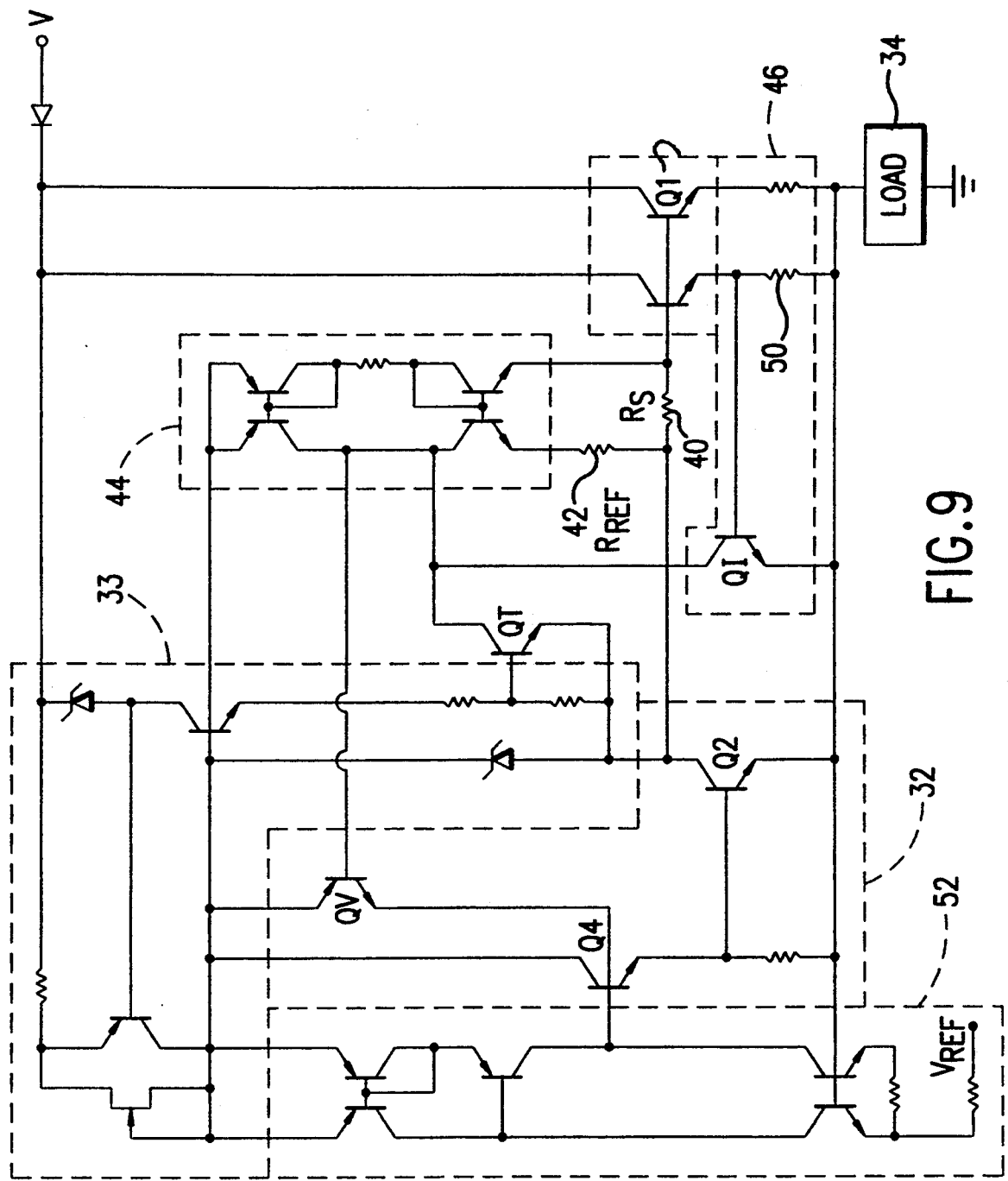
FIG. 9 is a second embodiment of the voltage, current and thermal protection circuit of the present invention.

The circuit of FIG. 8 may be implemented by the circuit of FIG. 9. With reference to FIG. 9, where like elements have been accorded like numerical designations, a transistor Q1 to be protected is illustrated as parallel NPN transistors. It is to be understood that transistor Q1 in FIG. 9, as in all other embodiments, may be any number of transistors ganged together in a conventional manner, typically to share the load current and thus spreading the heat.

In operation, the resistor 40 converts the reverse base current into a voltage signal compared in the error amplifier 44 with the threshold voltage across resistor 42. The output signal from the amplifier 44 is used to control the operation of the transistor 32. Because the reverse base current is proportional to the collector current and to the factor M which contains the collector-base voltage $V_{CB}$ as an exponent (Equation 1), feedback can be used to control the base voltage and thus the collector current, i.e., the maximum reverse base current can be limited to a fixed value for all voltages between $BV_{CEO}$ and $BV_{CBO}$. Further, because the voltage dependent or avalanche current is being limited, response times are much faster than available in a thermal shutdown circuit.

As shown in FIG. 9, a conventional band gap reference generator 52 provides a stable regulated voltage for the circuit. A bias circuit 33 provides an essentially constant current through the resistor 40 to the base of the transistor Q1. The circuit 33, together with the variable impedance provided by the transistor Q2, provide a voltage divider which controls the base bias voltage to the transistor Q1.

The current sensor 46 may include a resistor 50 in the emitter circuit of one of the transistors in Q1, here assumed to carry a known percentage of the total load current. As the current through the resistor 50 increases, the increase in the resultant voltage at the base of the transistor QI will cause conduction of the transistor QI, which in turn causes a change in the output signal of the comparator 44 within the voltage sensor 30. This causes the conduction of the transistors QV and Q4, and ultimately transistor Q2 in the variable impedance element 32 to change the base bias of the transistor Q1.

The thermal sensor 48 of FIG. 8 is shown as the transistor QT in FIG. 9 and is located in thermal communication with the transistor Q1 by a common heat sink or perhaps by physical location on a common semiconductor material in an integrated circuit. The transistor QT may be biased just short of conduction, and because of its temperature response characteristics, can be caused to conduct upon the detection of excessive heat in the transistor Q1. The conduction of transistor QT changes the output signal of the comparator 44 to cause the conduction of the transistor QV are described above, ultimately reducing the base bias of the transistor Q1 by the conduction of the transistor Q2.

The voltage sensor 30 of FIG. 8 may take the form of the comparator 44 and is responsive to the comparison of the voltages across the resistors $R_S$ and $R_{REF}$ to provide an output signal to the base of transistor QV, the conduction of which reduces the base bias of the transistor Q1 by the conduction of the transistor Q2 as earlier described.

Thus the transistor Q1 is protected against excessive voltage, current and heat, all operable through the control of a variable impedance which controls the base bias of the transistor.

Figure 10:
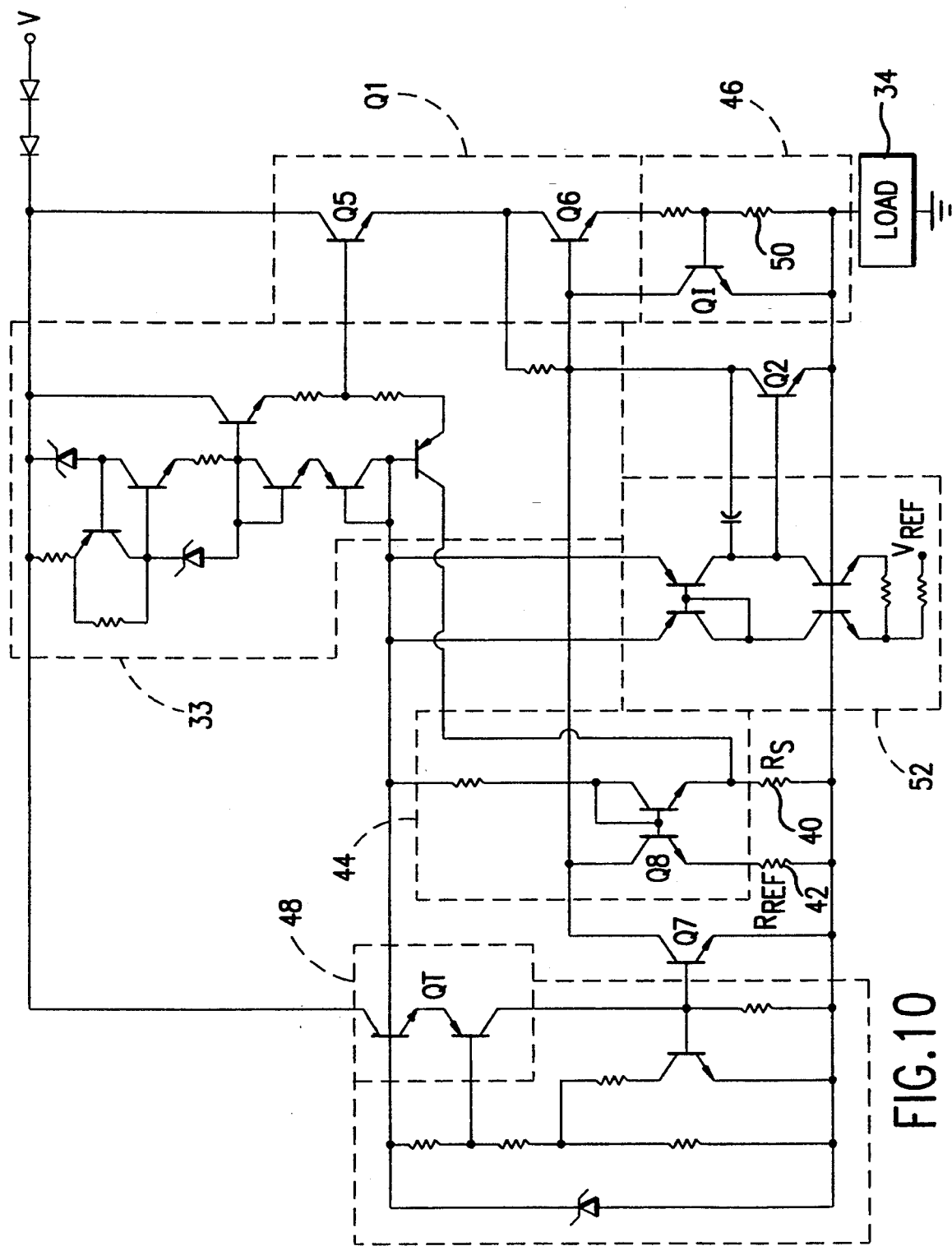
FIG. 10 is a third embodiment of the voltage, current and thermal protection circuit of the present invention.

A further embodiment of the high voltage linear regulator of FIG. 9 is shown in FIG. 10. With reference to FIG. 10, where like elements have been accorded like numerical designations to facilitate a comparison with prior figures, a conventional band gap reference generator 52 provides a stable regulated voltage for the circuit and a bias circuit 33 provides an essentially constant current through the resistor 40 to the load 34. In contrast with the circuit of FIG. 9, the resistor is not located in the base circuit of the transistor to be protected. In FIG. 10, the transistor Q1 is illustrated as two series connected transistors Q5 and Q6, and the conduction of the transistor Q5 is controlled, not by the base bias, but by the conduction of the transistor Q6.

The current sensor 46 may include a resistor 50 in the emitter circuit of the transistor Q6. As the current through the resistor 50 increases, the increase in the resultant voltage at the base of the transistor QI will cause conduction of the transistor QI, which in turn decreases the base bias from the transistor Q6 and thus its conduction. Because they are series connected, a reduction in the conduction of the transistor Q6 reduces the conduction of the transistor Q5.

The thermal sensor 48 of FIG. 8 is shown as the transistor pair QT in FIG. 10 located in thermal communication with the transistor Q5. The transistor QT may be biased just short of conduction, and because of its temperature response characteristics, can be caused to conduct upon the detection of excessive heat in the transistor Q5. The conduction of transistor QT causes the conduction of the transistor Q7 to reduce the base bias of the transistor Q6, thus reducing the conduction of the transistor Q5 as earlier described.

The voltage sensor 30 of FIG. 8 may take the form of the comparator 44 and is responsive to the comparison of the voltages across the resistors $R_S$ and $R_{REF}$ to cause the conduction of the transistor Q8 to provide reduce the base voltage of the transistor Q6 and the conduction of the transistor Q5 as earlier described.

Thus the transistor Q1 (Q5 and Q6) is protected against excessive voltage, current and heat, all operable through the control of variable impedances which independently control the base bias of the transistor Q6.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A circuit for extending the safe operating area of a transistor with a base biasing voltage comprising:
    sensing means for sensing transistor reverse base current; and
    adjusting means responsive to said sensing means for adjusting the transistor base bias voltage to thereby limit transistor reverse base current so that the total base current of said transistor base decreases as transistor reverse base current increases.

2. The circuit of claim 1 wherein said sensing means includes a comparator of (a) a voltage related to the sensed transistor reverse base current, and (b) a reference voltage.

3. The circuit of claim 1 wherein said sensing means includes a second transistor connected to the base of the first referenced transistor.

4. The circuit of claim 1 wherein said sensing means includes a unidirectional current device.

5. The circuit of claim 1 wherein said adjusting means includes a variable voltage divider having a tap connected to said sensing means.

6. The circuit of claim 5 wherein the tap of said voltage divider is intermediate two elements one of which includes a variable impedance.

7. The circuit of claim 6 wherein said variable impedance element includes a transistor.

8. An integrated circuit for operating a base biased transistor at voltages above its $BV_{CEO}$ comprising means for providing a base bias for a transistor and means for reducing said bias in response to the detection of a reverse base current.

9. A circuit for protecting a BJT having collector and emitter currents responsive to a total base current that includes an externally supplied base current and an internally supplied base current resulting from avalanche multiplication comprising:
    means for detecting the existence of the internally supplied base current; and
    means responsive to said detecting means for limiting the total base current.

10. The circuit of claim 9 wherein said limiting means includes means for reducing the externally supplied base current.

11. The circuit of claim 9 wherein said detecting means includes means for detecting the total base current.

12. The circuit of claim 9 further comprising thermal sensor means for sensing the temperature of the BJT and wherein said limiting means is responsive to said thermal sensor.

13. The circuit of claim 9 further comprising a load current sensor for sensing one of the collector and emitter currents of the BJT and wherein said limiting means is responsive to said load current sensor.

14. A circuit for protecting a transistor having collector and emitter currents responsive to a total base current that includes an externally supplied base current and a reverse base current resulting from avalanche multiplication comprising:
    means for detecting the existence of the reverse base current;
    thermal sensor means for sensing the temperature of the transistor;
    a load current sensor for sensing one of the collector and emitter currents of the transistor; and
    means responsive to said detecting means, said thermal sensor means and said load current sensor for limiting the total base current by limiting the externally supplied base current.

15. A circuit for detecting a voltage higher than the $BV_{ceo}$ of a transistor but less than the $BV_{cbo}$ thereof comprising:
    sensing means connected to the base of a BJT for passing a base-collector current;
    means for detecting a voltage drop across said sensing means; and
    means responsive to said detecting means for reducing base-collector current by an amount related to the detected voltage drop.

16. The circuit of claim 15 wherein said unidirectional means includes a diode; and
    wherein said detecting means includes a second BJT having one PN junction connected across said diode.

17. The circuit of claim 16 wherein said BJT is a NPN transistor; and
    wherein said second BJT is a PNP transistor having its base and emitter connected across said diode.

18. A method for extending the safe operating area of a transistor comprising:
  (a) sensing transistor reverse base current; and
  (b) adjusting the base bias voltage of the transistor responsively thereto.

19. The method of claim 18 wherein reverse base current is sensed by comparing (i) the voltage drop across an impedance element in the base circuit of the transistor with (ii) a predetermined reference voltage.

20. The method of claim 19 wherein the impedance element is one of a resistor and a diode.

21. The method of claim 20 wherein the predetermined reference voltage is the voltage at which a BJT conducts.

22. The method of claim 18 wherein the base bias voltage is adjusted by varying the impedance of one element of a variable voltage divider.

23. The method of claim 18 wherein the impedance is varied by controlling the degree of conduction of a transistor.

24. In an integrated circuit, the method of operating a base biased transistor at voltage above its BVceo comprising the steps of:
  (A) providing a transistor with a base bias; and
  (B) reducing the base bias in response to the detection of a reverse base current.

25. A method of protecting a BJT having collector and emitter currents responsive both to a total current including an externally supplied base current and an internally supplied base current resulting from avalanche multiplication comprising the steps of:
  (a) detecting the existence of an internally supplied base current; and
  (b) limiting the total base current responsive to the detection.

26. The method of claim 25 wherein total base current is limited by reducing the externally supplied base current.

27. The method of claim 25 wherein the internally supplied base current is detected by detecting the total base current.

28. The method of claim 25 further comprising the steps of sensing the temperature of the BJT and limiting the externally supplied base current responsive to the sensed temperature.

29. The method of claim 25 further comprising the steps of sensing the load current in one of the collector and emitter of the BJT and limiting the externally supplied base current responsive to the sensed load current.

30. A method for detecting a voltage higher than the $BV_{CEO}$ of a transistor but less than the $BV_{CBO}$ thereof comprising the steps of:
  (a) providing an unidirectional current conducting means in the base circuit of a BJT for passing a base-collector current while blocking the passage of an emitter-base current; and
  (b) detecting a voltage drop across the unidirectional means.

31. A circuit for detecting a voltage higher than the BVceo of a transistor but less than the BVcbo thereof comprising:
  sensing means connected to the base of a BJT for passing a base-collector current;
  means for detecting a voltage drop across said sensing means; and
  means responsive to said detecting means for reducing base-collector current,
  said sensing means including unidirectional current conducting means connected to the base of a BJT for passing a base-collector current while blocking the passage of an emitter-base current.

32. A circuit for detecting a voltage higher than the BVceo of a transistor but less than the BVcbo thereof comprising:
  sensing means connected to the base of a BJT for passing a base-collector current;
  means for detecting a voltage drop across said sensing means;
  means responsive to said detecting means for reducing base-collector current;
  a variable voltage divider having a second transistor as one element thereof; and
  means for adjusting the base bias voltage of the first transistor by varying the degree of conduction of said second transistor.

33. A circuit for detecting a voltage comprising:
  sensing means connected to the base of a BJT for passing a base-collector current;
  means for detecting a voltage drop across said sensing means, said voltage being higher than the BVceo of said BJT but less than the BVcbo thereof; and
  means responsive to said detecting means for reducing base-collector current of said BJT.

34. The circuit of claim 33 wherein said sensing means includes a diode; and
  wherein said detecting means includes a second BJT having one PN junction connected across said diode.

35. The circuit of claim 34 wherein said first mentioned BJT is an NPN transistor; and
  wherein said second BJT is a PNP transistor having its base and emitter connected across said diode.

* * * * *